(12) United States Patent
Annunziata et al.

(10) Patent No.: US 9,536,926 B1
(45) Date of Patent: Jan. 3, 2017

(54) MAGNETIC TUNNEL JUNCTION BASED ANTI-FUSES WITH CASCODED TRANSISTORS

(71) Applicant: INTERNATIONAL BUSINESS MACHINES CORPORATION, Armonk, NY (US)

(72) Inventors: Anthony J. Annunziata, Stamford, CT (US); John K. Debrosse, Colchester, VT (US); Chandrasekharan Kothandaraman, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/978,013

(22) Filed: Dec. 22, 2015

(51) Int. Cl.
| | |
|---|---|
| *G11C 11/16* | (2006.01) |
| *H01L 27/22* | (2006.01) |
| *H01L 23/525* | (2006.01) |
| *H01L 43/02* | (2006.01) |
| *H01L 43/08* | (2006.01) |
| *H01L 43/12* | (2006.01) |

(52) U.S. Cl.
CPC ......... *H01L 27/228* (2013.01); *H01L 23/5252* (2013.01); *H01L 43/02* (2013.01); *H01L 43/08* (2013.01); *H01L 43/12* (2013.01)

(58) Field of Classification Search
CPC ...... G11C 11/16; G11C 11/1653; G11C 11/14; G11C 11/22; G11C 14/0027; G11C 14/0081
USPC ........................................................ 365/158
See application file for complete search history.

(56) References Cited

U.S. PATENT DOCUMENTS

| | | | |
|---|---|---|---|
| 5,744,979 A | 4/1998 | Goetting | |
| 6,001,693 A | 12/1999 | Yeouchung et al. | |
| 6,473,337 B1 * | 10/2002 | Tran | G11C 11/15 257/E27.005 |
| 6,724,238 B2 * | 4/2004 | Derner | G11C 17/18 327/525 |
| 6,751,149 B2 | 6/2004 | Seyyedy et al. | |
| 6,788,607 B2 * | 9/2004 | Duval | G11C 17/18 365/189.07 |
| 2004/0252551 A1 * | 12/2004 | Iwata | G11C 11/16 365/158 |
| 2006/0158919 A1 * | 7/2006 | Inaba | G11O 5/063 365/63 |
| 2015/0014785 A1 | 1/2015 | Chung | |

FOREIGN PATENT DOCUMENTS

| | | |
|---|---|---|
| JP | 2015115083 A | 6/2015 |
| KR | 1020140006189 A | 1/2014 |

* cited by examiner

*Primary Examiner* — Alexander Sofocleous
*Assistant Examiner* — Alfredo Bermudez Lozada
(74) *Attorney, Agent, or Firm* — Cantor Colburn LLP; Vazken Alexanian

(57) ABSTRACT

Magnetic tunnel junction antifuse devices are protected from degradation caused by programming voltage drop across the gates of unselected magnetic tunnel junction antifuses by connecting said magnetic tunnel junction serially with a first field effect transistor and a second field effect transistor, the first field effect transistor having its gate connected to a positive supply voltage while the gate of the second field effect transistor is switchably connected to a programming voltage.

13 Claims, 5 Drawing Sheets

MAGNETIC TUNNEL JUNCTION BASED ANTI-FUSES WITH CASCODED TRANSISTORS

BACKGROUND

The present invention relates to semiconductor processing technology and, in particular, concerns a device and a fabrication process whereby a Magnetoresistive Random Access Memory (MRAM) structure can be used as a selectively programmable antifuse device.

Since the introduction of the digital computer, electronic storage devices have been a vital resource for the retention of binary data. Conventional semiconductor electronic storage devices incorporate capacitor type structures, which are referred to as Dynamic Random Access Memory (DRAM) that temporarily store binary data based on the charged state of a capacitor. This type of semiconductor Random Access Memory (RAM) requires a continuous supply of power and a periodic charge refresh to maintain a particular defined logic-state. As a result, semiconductor RAM is considered volatile memory due to the fact that data can be lost with the loss of power.

For many applications, it may be desirable to replace traditional volatile memory with an improved solid-state non-volatile memory device. This need has fueled research and development in the area of non-volatile memory storage devices while still maintaining a high-density fabrication process and technique. The increased demand for a more sophisticated, efficient, and non-volatile data retention technique has driven the development of Magnetoresistive Random Access Memory (MRAM) devices.

MRAM is a developing technology that offers the advantages of non-volatility and high-density fabrication. MRAM structures employ the spin property of electrons within layers of magnetic material to read the memory storage logic states. Binary logic states typically take advantage of a resistance differential to distinguish between "on" and "off" states. Resistance is a measure of the inability of an electrical current to flow through a specific material, whereas current is the actual flow of charge carriers through a material. If a material has a high resistance, then the ability of electrons to flow through the material is inhibited. Conversely, a low resistive material tends to allow a higher degree of current to flow.

MRAM structures take advantage of this resistivity concept by manipulating the alignments of spin states within multiple layers of material to increase or decrease the resistance of a material. Magnetic Tunnel Junctions (MTJ), for example, are electronic structures that exhibit a high resistance across the tunneling dielectric structure. MTJ based MRAM devices incorporate at least two thin layers of magnetic material separated by an insulating tunnel barrier.

The magnetic and insulating layers are fabricated on the substrate, The MRAM magnetic layers consist of a magnetic pinned layer and a magnetic free layer. The selective programmability of the sense layer enables the MRAM structure to act as a logic state device, which stores binary data as directions of net magnetization vectors in the metallic MTJ layers. Current flow through two orthogonal conductive traces induces a magnetic moment in a parallel or anti-parallel configuration between the pinned layer and the sense layer. Alternatively, current flow through the MTJ layers, can change the orientation of the magnetization in the free layer through the spin-torque-transfer effect.

MRAM structures employ the nature of spin dependent variable resistance when used to define logic states wherein the high and low resistivity states represent a logical "1", or "0," respectively. The corresponding parallel and antiparallel magnetization states reflect and represent two different resistances. The overall MTJ resistance has minimum and maximum values when the net magnetization vectors of the two individual magnetic layers point in substantially the same (parallel) and opposite (antiparallel) directions, respectively. When these materials are layered in a particular fashion, they exhibit a variable vertical electrical resistance depending on the magnetization state of the individual layers.

Due to the physical arrangements of MTJ layers, MRAM structures may be fabricated using similar integration techniques as conventional DRAM. In addition, integrated circuits often implement permanent programmable electrical connections between circuit nodes. They are useful to repair defective elements on the chip and to customize the chip for different applications. One type of permanent programmable electrical connections is referred to as an antifuse link. Field Programmable Gate Array (FPGA) devices may employ antifuse structures for their high-density fabrication ability and efficient ease of programmability. Application Specific Integrated Circuits (ASICs) may make use of antifuses for effective system logic implementation on a single chip.

A fuse is often used in an electrical circuit to inhibit the excessive flow of electrons by creating a permanent open circuit at the fuse. When a fuse is "blown," the permanently open circuit stops the flow of charge carriers through the electrical circuit at the fuse. In contrast, an antifuse is often used in an electrical circuit to allow an open flow of charge carriers by creating a permanent short circuit at the fuse. When an antifuse is "blown," a permanent short is created at the antifuse.

Conventional antifuse devices in a DRAM array may be fabricated with a structure similar to that of a capacitor, i.e., a dielectric layer separated by two conductive electrical terminals. Initially, an antifuse device is fabricated in the "off" state, which presents a high resistance between antifuse terminals. Conversely, the "on" state represents a lower resistive connection between antifuse terminals. To program an antifuse "on" state, a large programming voltage, usually between 7 and 9 volts, may be applied across the antifuse terminals, which causes breakdown of the interposed dielectric and forms a short circuit between the antifuse terminals. However, the short circuit produced by high voltage can be unreliable. Accordingly, alternative methods, such as laser fusing is generally employed to program antifuses in DRAM circuits. Though more reliable, such processes are cumbersome, particularly where they depend upon the use of different materials on structures from adjacent cell capacitors, which may require additional processing steps during fabrication. An even larger voltage could be used to better break down the dielectric material, but such a voltage is more likely to cause damage to neighboring circuitry.

Hence, the use of conventional antifuse devices in MRAM types of devices may be expensive in terms of production costs and in terms of loss of available space for other circuit components. Additionally, the use of conventional antifuse devices may potentially cause damage to neighboring circuit components due to the relatively high programming voltage needed to change the antifuse from a non-conducting state to a conducting state. Thus, there exists a need for an improved method of manufacturing antifuse devices that do not consume as much substrate space and do not add additional processing steps to the process of fabricating integrated circuitry. More particularly, there is a need for an antifuse device that is better suited for fabrication with MRAM type devices that may be programmed in a safer manner.

SUMMARY

According to an embodiment of the present invention, a method is provided for protecting an unselected magnetic tunnel junction in an array from being accidentally blown by antifuse programming voltage applied to a selected magnetic tunnel junction wired in parallel therewith, the method comprising: connecting said magnetic tunnel junction serially with a first field effect transistor and a second field effect transistor, the first field effect transistor having its gate connected to a positive supply voltage while the gate of the second field effect transistor is switchably connected to a programming voltage.

According to an embodiment of the present invention, a device is provided containing a magnetic tunnel junction connected serially with a first field effect transistor and a second field effect transistor.

According to another embodiment of the present invention, a method is provided for protecting unselected magnetic tunnel junctions in an array from being accidentally blown by antifuse programming voltage applied to a selected magnetic tunnel junction wired in parallel comprising connecting each of the magnetic tunnel junctions to be protected serially with a first field effect transistor and a second field effect transistor, the first field effect transistor having its gate permanently tied to Vdd (positive supply voltage pin in FET) while the gate of the second field effect transistor is switched to program the anti-fuse.

BRIEF DESCRIPTION OF THE DRAWINGS

The subject matter, which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

A magnetic tunnel junction stores information by switching the magnetization state of the free layer. When magnetization direction of the free layer is parallel to the magnetization direction of the reference layer, the magnetic tunnel junction is in a low resistance state. Conversely, when the magnetization direction of the free layer is antiparallel to the magnetization direction of the reference layer, the magnetic tunnel junction is in a high resistance state. The difference in resistance of the MTJ may be used to indicate a logical '1' or '0', thereby storing a bit of information. The tunneling magnetoresistance of a magnetic tunnel junction determines the difference in resistance between the high and low resistance states. A relatively high difference between the high and low resistance states facilitates read operations in the MRAM.

Anti-fuses are necessary for redundancy and yield in memory arrays. Furthermore, they are required for permanently holding chip-ID information that has to survive packaging processes—specifically relevant to MRAM.

This invention describes a circuit for enabling anti-fuse function without increasing the potential reliability failures in unselected parallel circuits associated with higher programming voltages of the anti-fuse.

Since the programming voltage of the antifuse, which typically is in excess of 1.5V to 2V, is present across the un-selected transistor's gate drain junction, the transistor is subjected to degradation of the oxide. Bias line voltage is typically in the range of 1 volt and Vdd is typically in the range of 200 millivolts to 300 millivolts. Typical solutions to increase resistance to degradation caused by antifuse programming voltage involve using thicker oxide transistors to better withstand tunneling effects. However, adding thicker oxide transistors increases the space required for the antifuse circuit.

Using cascoded transistors attached to each anti-fuse, with the top-gate permanently tied to Vdd (positive supply voltage pin in FET) while the bottom gate is switched to program the anti-fuse ensures that the voltage drop across the gates of either transistor is kept low.

Figure 1:
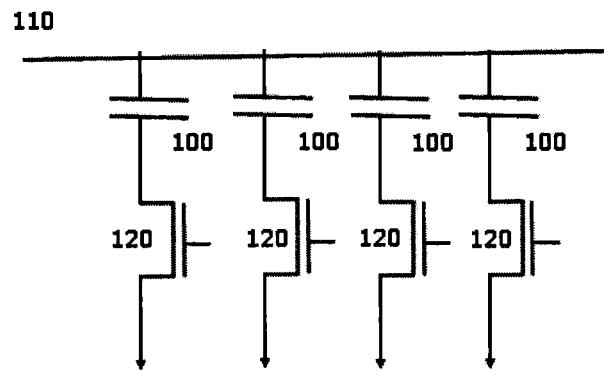
FIG. 1 is a plan view showing four magnetic tunnel junction antifuses connected in series to one field effect transistor.

With reference now to FIGS. 1, 1A, 2 and 2A. FIG. 1 is a plan view showing four magnetic tunnel junction antifuses 100 each connected in parallel, and each having one electrode connected to Bias Line 110 voltage and the other electrode connected to an electrode of field effect transistor 120 whose gate is switchable to program the magnetic tunnel junction antifuse 100.

Figure 1A:
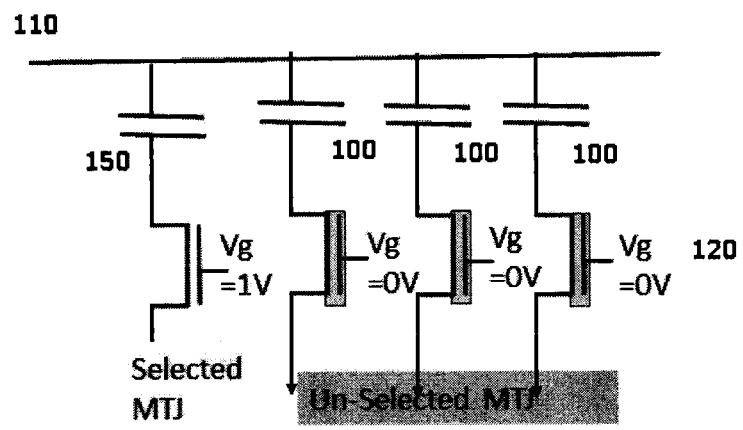
FIG. 1A is a plan view showing four magnetic tunnel junction antifuses, in which one field effect transistor is switched to program voltage.

FIG. 1A is a plan view showing four magnetic tunnel junction antifuses 100 each connected in parallel, having one electrode connected to Bias Line 110 voltage and the other electrode connected to an electrode of field effect transistor 120, in which one of the four field effect transistor gates is switched to program the magnetic tunnel junction antifuse 150, and the gate of the other three transistors 120 remain unswitched.

Figure 2:
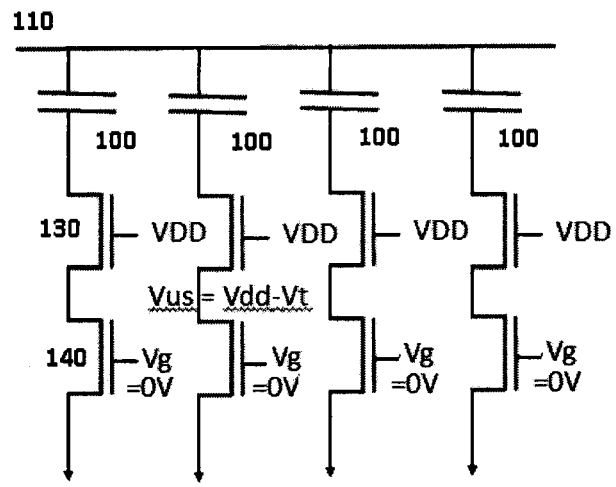
FIG. 2 is a plan view showing four magnetic tunnel junction antifuses connected in parallel, and each connected serially to a first field effect transistor and a second field effect transistor.

FIG. 2 is a plan view showing four magnetic tunnel junction antifuses 100 each connected in parallel, having one electrode connected to Bias Line 110 voltage and the other connected in series to field effect transistor A 130 and field effect transistor B 140. The gate of transistor A 130 is connected to $V_{dd}$, which designates the positive supply voltage pin in FET (field effect transistor). The gate of transistor B 140 is switchable to program the magnetic tunnel junction antifuse 100.

Figure 2A:
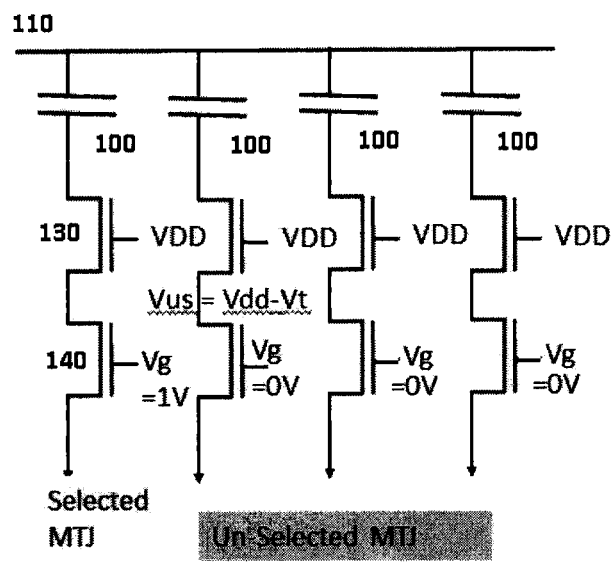
FIG. 2A is a plan view showing four magnetic tunnel junction antifuses connected in parallel, and each connected serially to a first field effect transistor and a second field effect transistor, which one of the second field effect transistors is switched to program voltage.

FIG. 2A is a plan view showing four magnetic tunnel junction antifuses 100 each connected in parallel, having one electrode connected to Bias Line 110 voltage and the other connected in series to field effect transistor A 130 and field effect transistor B 140. The gate of transistor A 130 is connected to $V_{dd}$, which designates the positive supply voltage pin in FET (field effect transistor). The gate of one of the four transistors B 140 is switched to program the magnetic tunnel junction antifuse 100 to produce a programmed resistance of 10 ohms to 1 kilo-ohm, and the gate of the other three transistors B 140 remain unswitched, having an unprogrammed resistance of 10-20 kilo-ohms.

Figure 3:
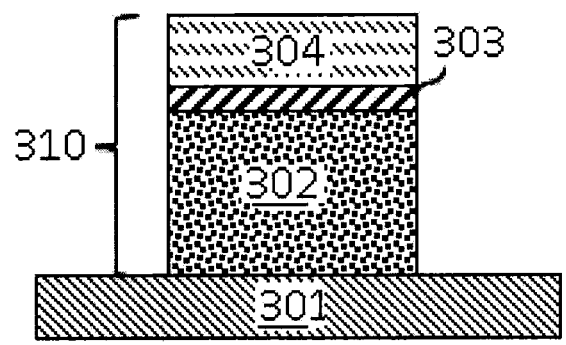
FIG. 3 is a cross-sectional side view of a patterned magnetic tunnel junction stack.

FIGS. 3-6 illustrate exemplary methods of making MRAM devices according to various embodiments. FIG. 3 is a cross-sectional side view of a patterned magnetic tunnel junction stack 310 positioned on a contact electrode 301. The magnetic tunnel junction stack 310 includes a reference layer 302, a tunnel barrier layer 303, and a free layer 304.

The contact electrode 301 includes a conductive material (s) and forms the bottom contact electrode of the MRAM device. Non-limiting examples of conductive materials for the contact electrode include tantalum, tantalum nitride, titanium, or any combination thereof.

The contact electrode 301 may be formed by depositing a conductive material(s) onto a surface. The conductive material(s) may be deposited by, for example, physical vapor deposition (PVD), ion beam deposition (IBD), atomic layer deposition (ALD), electroplating, or other like processes.

To form the magnetic tunnel junction stack 310, the reference layer 302 is formed on the contact electrode 301; the tunnel barrier layer 303 is formed on the reference layer 302; and the free layer 304 is formed on the tunnel barrier layer 303.

The reference layer 302 and the free layer 304 include conductive, magnetic materials, for example, metals or metal alloys. The reference layer 302 and the free layer 304 may be formed by employing a deposition process, for example, PVD, IBD, ALD, electroplating, or other like processes.

The reference layer 302 and the free layer 304 may include one layer or multiple layers. The reference layer 302 and the free layer 304 may include the same materials and/or layers or different materials and/or layers.

Non-limiting examples of materials for the reference layer 302 and/or the free layer 304 include iron, cobalt, boron, aluminum, nickel, silicon, oxygen, carbon, zinc, beryllium, vanadium, boron, magnesium, or any combination thereof.

The reference layer 302 has a thickness that may generally vary and is not intended to be limited. In some embodiments, the reference layer 302 has a thickness in a range from about 5 to about 25 nm. In other embodiments, the reference layer 302 has a thickness in a range from about 10 to about 15 nm.

The free layer 304 has a thickness that may generally vary and is not intended to be limited. In some embodiments, the free layer 304 has a thickness in a range from about 5 to about 25 nm. In other embodiments, the free layer 304 has a thickness in a range from about 10 to about 15 nm.

The tunnel barrier layer 303 includes a non-magnetic, insulating material. A non-limiting example of an insulating material for the tunnel barrier layer 303 is magnesium oxide (MgO). The tunnel barrier layer 303 may be formed on the reference layer 302 by, for example, radiofrequency (RF) sputtering in some embodiments. Alternatively, the tunnel barrier layer 303 is formed by oxidation (e.g., natural or radical oxidation) of a magnesium (Mg) layer deposited on the reference layer 302. After oxidation, the MgO layer may then be capped with a second layer of Mg. The thickness of the tunnel barrier layer 303 is not intended to be limited and may generally vary.

After depositing the magnetic tunnel junction stack 310 layers on the contact electrode 301, the magnetic tunnel junction stack 310 is patterned. In some embodiments, a hard mask material layer may be disposed on the magnetic tunnel junction stack 310. The hard mask material layer is then patterned by etching, for example, using a reactive ion etch (RIE) process or a halogen-based chemical etch process (e.g., including chlorine-containing gas and/or fluorine-containing gas chemistry). The pattern from the hard mask is transferred into the free layer 304, tunnel barrier layer 303, and reference layer 301. The free layer 304, tunnel barrier layer 303, and reference layer 302 are etched by, for example, performing a MRAM stack etch process. The stack etch process may be a ME process or an ion beam etch (IBE) process.

Figure 4:
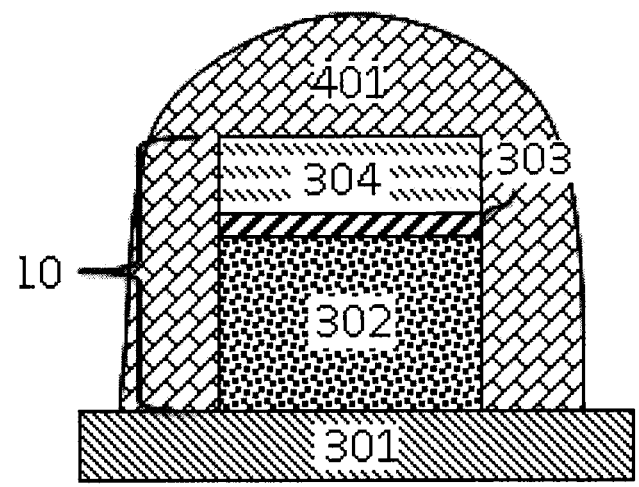
FIG. 4 is a cross-sectional side view after depositing an encapsulating layer 401 on the magnetic tunnel junction stack.

FIG. 4 is a cross-sectional side view after depositing an encapsulating layer 401 on the magnetic tunnel junction stack 310. The encapsulating layer 401 includes one or more insulating materials. The insulating layer 401 encapsulates the magnetic tunnel junction stack 310. The encapsulating layer 401 is deposited on the exposed surface and sidewalls of the magnetic tunnel junction stack 310 and contacts the contact electrode 301.

The thickness of the encapsulating layer 401 may generally vary and is not intended to be limited. In some embodiments, the thickness of the encapsulating layer 401 is in a range from about 10 to about 60 nm. In other embodiments, the thickness of the encapsulating layer 401 is in a range from about 25 to about 40 nm. To achieve a desired encapsulating layer thickness of, for example, silicon nitride, several cycles of deposition may be performed. To achieve a desired encapsulating layer thickness of, for example, aluminum oxide, several cycles of deposition and oxidation may be performed.

The encapsulating layer 401 may be deposited by methods such as chemical vapor deposition (CVD), plasma enhanced chemical vapor deposition (PECVD), physical vapor deposition (PVD), and the like.

In some embodiments, the encapsulating layer 401 can be deposited using a PVD method. The deposition conditions for forming the encapsulating layer 401 using PVD methods includes low sample temperatures (e.g., about room temperature), low power and deposition rates, and slightly reactive plasma. The PVD method may be performed at a temperature range from about 20 to about 25° C., or at room temperature.

The encapsulating layer 401 may include, for example, AlOx or SiNx. Sub-stoichiometric amounts of AlOx and SiNx may be formed using various levels of the appropriate reactive gas ($O_2$ or $N_2$). The encapsulating film 401 may include, for example, $SiN_x$ or $AlO_x$, wherein x is the ratio of N to Si and O to Al, respectively, and x may be varied to range from pure elemental Si/Al to stoichiometric $Si_3N_4$ or $Al_2O_3$. In one embodiment, the encapsulating layer 401 includes $SiN_x$, and x is from 0 to 1.33 (i.e., pure Si to $Si_3N_4$). In another embodiment, the encapsulating layer 401 includes $AlO_x$, and x is from 0 to 1.5 (i.e., pure Al to $Al_2O_3$). In some embodiments, the encapsulating layer 401 comprises silicon nitride, aluminum oxide, or a combination thereof.

Figure 5:
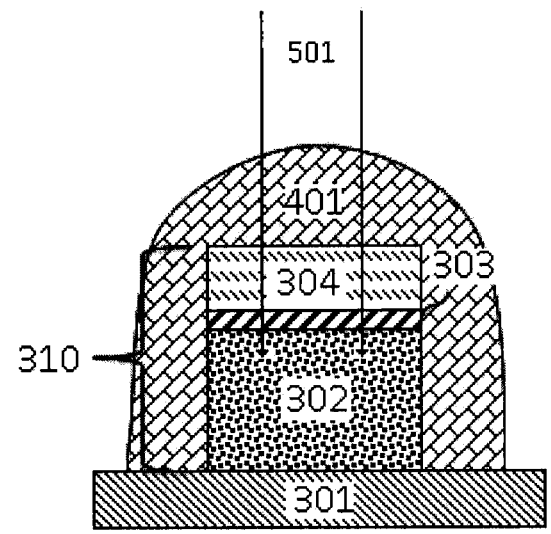
FIG. 5 is a cross-sectional side view after depositing an interlayer dielectric (ILD) layer on the MTJ stack.

FIG. 5 is a cross-sectional side view after depositing an interlayer dielectric (ILD) layer 501 on the MTJ stack 310. The ILD layer 501 may include, for example, a low-k dielectric oxide, including but not limited to, silicon dioxide, spin-on-glass, a flowable oxide, a high-density plasma oxide, or any combination thereof. The ILD layer 501 may be formed by performing deposition process, including, but not limited to CVD, PVD, plasma enhanced CVD, atomic layer deposition (ALD), evaporation, chemical solution deposition, or like processes.

Annealing means exposing the MRAM device to heat to change its properties. For a magnetic tunnel junction to function well, there needs to be sufficient resistance between the free layer 304 and reference layer 302. If the MRAM device is suitably annealed, the resistance properties of the magnetic tunnel junction can be altered to increase resistance and improve the functioning of the device. In some embodiments, annealing can be performed at a temperature from about 200 to about 500° C., or from about 250 to about 350° C. In some embodiments the time of annealing is from 10 minutes to 3 hours, or from about 30 minutes to about 2 hours, and in some embodiments there can be multiple annealing steps. In some embodiments there may be a magnetic field applied to the MRAM device during the annealing process.

Figure 6:
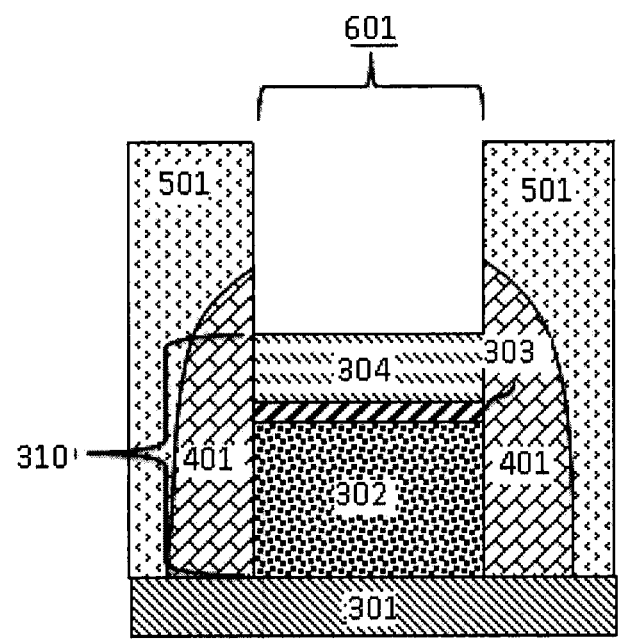
FIG. 6 is a cross-sectional side view of a device after forming a magnetic tunnel junction trench which exposes a portion of the free layer.

FIG. 6 is a cross-sectional side view of a device after forming a magnetic tunnel junction trench 601 which exposes a portion of the free layer 304. The magnetic tunnel trench can be formed by a variety of methods, for example by reactive ion etching (ME).

Figure 7:
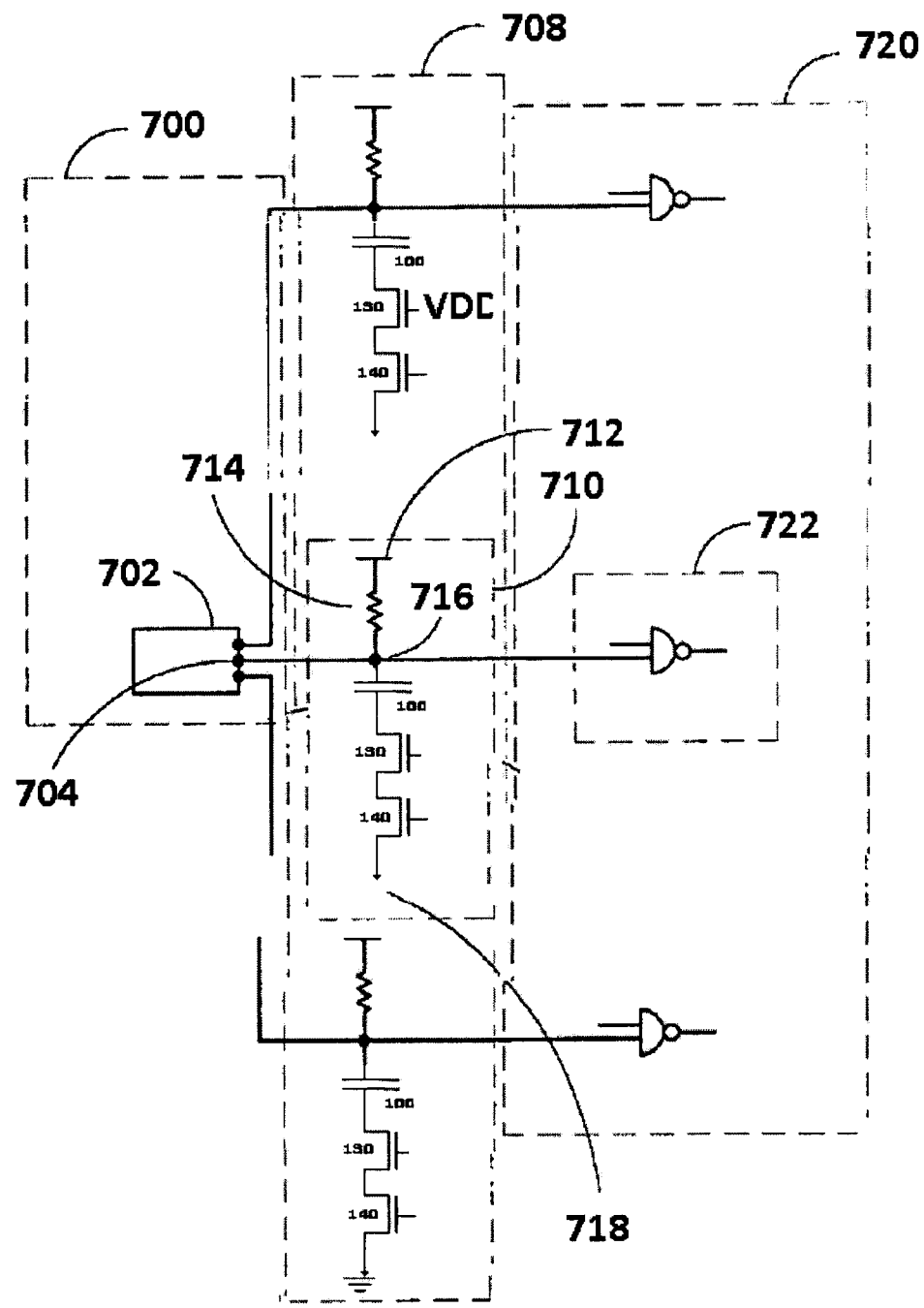
FIG. 7 illustrates an exemplary circuit where the antifuse devices are used to selectively program components of the MRAM.

FIG. 7 illustrates an exemplary circuit where the antifuse devices are used to selectively program components of the MRAM. As previously described, antifuse elements may be permanently fused to produce a short circuit between components. The exact manner in which the antifuse devices 100 are connected to the various integrated circuit components of the MRAM device will, of course, vary depending on exact implementation of the MRAM circuit. A first sub-circuit 700 illustrates, in this embodiment, a first schematic depicting a decoder circuit 702, wherein the decoder circuit 702 selectively isolates an individual antifuse circuit, such as an antifuse circuit 710, for a dielectric breakdown short to ground. The decoder circuit 702 has an output terminal 704. Generally, decoder circuits demultiplex input control data for single bit selection of addressed output, whereby a voltage potential in the form of a bit select is sent to the isolated node. In this particular embodiment, if the node 716 is selected by the decoder output terminal 704, a control voltage is sent to the antifuse 100 by way of the node 716.

In one aspect, a control voltage, enabled by the decoder circuit 702, greater than 1.8 volts from the decoder output terminal 704 may be used to short the dielectric layer of the antifuse 100 to the potential of ground via the ground contact point 718. If the dielectric layer of the antifuse 100 is not shorted to the potential of the ground contact point 718, then the node 716 will be at the same voltage potential as the supply voltage 712. Otherwise, if the antifuse 100 is shorted to the ground contact point 718, then the node 716 will also be shorted to the ground contact point 718.

A second sub-circuit 708 illustrates a second schematic depicting the antifuse sense circuit 710. A voltage supply 712 has an output terminal coupled to one end of a resistor 714, wherein the opposite end of the resistor 714 is coupled to the node 716. The output terminal 704 of the decoder circuit 702 and the soft layer of the antifuse 100 are also coupled to the node 716 via the upper conductive trace. Furthermore, the reference layer of the antifuse 100 is coupled to a ground contact point 718 via the lower conductive trace and the first field effect transistor 130 and second field effect transistor 140.

A third sub-circuit 720 illustrates a third schematic depicting a logic block circuit 722. Logic block circuits, in this embodiment, have numerous applications, wherein one application employs antifuse structures for use with test circuitry when sensing memory element states. Conventional testing of memory element states is traditionally performed by semiconductor based antifuse structures. In this particular embodiment, antifuse test elements are MTJ based antifuse structures, such as the antifuse 100. The logic block circuit 722 has a first input terminal 724, wherein the input terminal 724 of the logic block circuit 722 is coupled to the node 716 of second sub-circuit 708.

When the antifuse 100 is shorted to the ground contact point 718, voltage applied to the antifuse sense circuit 710 bypasses the logic block circuit 722 at the node 716 due to the short through antifuse 100 to ground contact point 718. Shorting the node 716 to ground forces a voltage bypass of logic block circuit 722, which disables the logic block input terminal 724 and, thus, disables logic block circuit 722. As a result, the antifuse 100, in this embodiment, is a permanent programmable short for disabling temporary logic circuits.

Thus, the decoder circuit 700 may be programmed so as to permit the selective application of the control voltage to the nodes 716 to selectively short the antifuse devices 100. As illustrated in FIG. 7, the array of antifuse devices may thus be selectively shorted by the decoder circuit 700. The shorted antifuse devices may thereby be used to affect the logical outcome of a logic circuit 720 to achieve a desired circuit configuration of the M device or any other device that uses antifuse devices formed from MRAM materials in the manner described above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising a magnetic tunnel junction connected serially with a first field effect transistor and a second field effect transistor, wherein the second field effect transistor of one magnetic tunnel junction is switched to direct a selected voltage of from 1.5 to 2 volts to program the magnetic tunnel junction while the other magnetic tunnel junctions are unswitched, and the unswitched magnetic tunnel junctions and second field effect transistor do not experience a voltage drop across the gates thereof sufficient to degrade.

2. The device of claim 1, further comprising an array of magnetic tunnel junctions on a surface, in which a plurality of magnetic tunnel junctions in the array are connected in parallel and connected serially with a first field effect transistor and a second field effect transistor.

3. The device of claim 1, wherein the first field effect transistor is adjacent to the magnetic tunnel junction and is connected to a positive supply voltage.

4. The device of claim 1, wherein the magnetic tunnel junction has a resistance of 10 k$\Omega$ to 20 k$\Omega$ prior to application of a selected voltage and wherein the magnetic tunnel junction, upon application of the selected voltage is shorted across a tunnel dielectric layer so as to have a resistance of 10Ω to 1 kΩ.

5. The device of claim 1, wherein the selected voltage is approximately 1.8 volts.

6. A magnetoresistive random access memory device comprising an array of magnetic tunnel junctions on a surface, in which less than the total number of magnetic tunnel junctions in the array are connected serially with a first field effect transistor and a second field effect transistor, wherein the second field effect transistor of one magnetic tunnel junction is switched to direct a selected voltage of from 1.5 to 2 volts to program the magnetic tunnel junction while the other magnetic tunnel junctions are unswitched, and the unswitched magnetic tunnel junctions and second field effect transistor do not experience a voltage drop across the gates thereof sufficient to degrade.

7. The magnetoresistive random access memory device of claim 6, wherein the first field effect transistor is adjacent to the magnetic tunnel junction and is connected to a positive supply voltage.

8. The magnetoresistive random access memory device of claim 7, wherein the positive supply voltage is from 200 millivolts to 300 millivolts.

9. The magnetoresistive random access memory device of claim 6, wherein the magnetic tunnel junction has a resistance of 10 kΩ to 20 kΩ prior to application of a selected voltage and wherein the magnetic tunnel junction, upon application of the selected voltage is shorted across a tunnel dielectric layer so as to have a resistance of 10Ω to 1 kΩ.

10. The magnetoresistive random access memory device of claim 6, wherein the selected voltage is approximately 1.8 volts.

11. The magnetoresistive random access memory device of claim 6, wherein the magnetoresistive random access memory device comprises a plurality of magnetic tunnel junctions in parallel, each connected serially with a first field effect transistor and a second field effect transistor.

12. The magnetoresistive random access memory device of claim 6, further comprising a decoder circuit coupled to the second field effect transistors such that application of a programmed voltage can result in selective application of the selective voltage of one or more of the plurality of magnetic tunnel junctions thereby shorting one or more of the plurality of magnetic tunnel junctions.

13. The magnetoresistive random access memory device of claim 6, further comprising a logic circuit coupled to the plurality of magnetic tunnel junctions that selectively disables or enables portions of the device based upon the shorting of one or more of the plurality of magnetic tunnel junctions.

* * * * *